United States Patent
Mistretta et al.

(10) Patent No.: US 7,358,730 B2
(45) Date of Patent: Apr. 15, 2008

(54) DIFFUSION TENSOR IMAGING USING HIGHLY CONSTRAINED IMAGE RECONSTRUCTION METHOD

(75) Inventors: Charles A. Mistretta, Madison, WI (US); Andrew L. Alexander, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 11/524,751

(22) Filed: Sep. 21, 2006

(65) Prior Publication Data
US 2007/0156045 A1  Jul. 5, 2007

Related U.S. Application Data

(60) Provisional application No. 60/719,445, filed on Sep. 22, 2005, provisional application No. 60/774,314, filed on Feb. 17, 2006.

(51) Int. Cl.
*G01V 3/00* (2006.01)
(52) U.S. Cl. .......................... 324/307; 324/306
(58) Field of Classification Search .............. 324/307, 324/309, 306
See application file for complete search history.

(56) References Cited

U.S. PATENT DOCUMENTS

| | | | |
|---|---|---|---|
| 5,502,385 A | 3/1996 | Kuhn et al. | |
| 5,603,322 A | 2/1997 | Jesmanowicz et al. | |
| 5,604,778 A | 2/1997 | Polacin et al. | |
| 5,933,006 A | 8/1999 | Rasche et al. | |
| 6,445,184 B1 * | 9/2002 | Tanttu | 324/309 |
| 6,490,472 B1 | 12/2002 | Li et al. | |
| 6,807,248 B2 | 10/2004 | Mihara et al. | |
| 6,845,342 B1 * | 1/2005 | Basser et al. | 702/183 |
| 6,954,067 B2 | 10/2005 | Mistretta | |
| 7,034,531 B1 * | 4/2006 | Tuch et al. | 324/309 |
| 7,218,110 B2 * | 5/2007 | Zhang et al. | 324/309 |
| 2001/0027262 A1 | 10/2001 | Mistretta et al. | |

FOREIGN PATENT DOCUMENTS

| | | |
|---|---|---|
| EP | 0 627 633 A1 | 12/1994 |
| WO | WO 2005/026765 | 3/2005 |
| WO | WO 2005/069031 | 7/2005 |
| WO | WO/2007/038206 * | 4/2007 |

OTHER PUBLICATIONS

Wieslaw L. Nowinski, The Iterated Normalized Backprojection Method of Image Reconstruction, Institute of Computer Science, Polish Academy of Sciences Ordona 21 01-237 Warsaw, Poland.

(Continued)

*Primary Examiner*—Louis M. Arana
(74) *Attorney, Agent, or Firm*—Quarles & Brady LLP (57) ABSTRACT

Highly undersampled diffusion weighted image data sets are acquired for a plurality of different directions using a projection reconstruction pulse sequence. The acquired projection views are interleaved and are combined to form a more highly sampled data set that is used to reconstruct a composite image. A DWI image is reconstructed from each undersampled data set for each direction using a highly constrained backprojected method that employs the composite image. Diffusion tensor values are calculated from the DWI images.

12 Claims, 10 Drawing Sheets

OTHER PUBLICATIONS

Y. Huang et al, Time-Resolved 3D MR Angiography by Interleaved Biplane Projection, Proc. Intl. Soc. Mag. Reson. Med. 13 (2005).

T.A. Cashen et al, Comparison of Temporal and Spatial Undersampling Techniques for Time-Resolved Contrast-Enhanced MR Angiography, Proc. Intl. Soc. Mag. Reson. Med. 13, (2005).

Graeme C. McKinnon et al, Towards Imaging the Beating Heart Usefully with a Conventional CT Scanner, Trans. on Biomedical Eng., vol. BME-28, No. 2, pp. 123-127, Feb. 1981.

Kathryn L. Garden et al, 3-D Reconstruction of the Heart from few Projections: A Practical Implementation of the McKinnon-Bates Algorithm, Trans. on Biomedical Eng., vol. MI-5, No. 4, p. 233-234, Dec. 1986.

A.L. Wentland et al, Technique for Acquiring MR Images of CSF Flow During a Valsalva Maneuver, Med. Phys. Univ. of WI, Madison WI.

K.M. Johnson et al, Average and Time-Resolved Dual Velocity Encoded Phase Contrast Vastly Undersampled Isotropic Projection Imaging, Med. Phys. Univ. of WI, Madison WI.

K.M. Johnson et al, Transtenotic Pressure Gradient Measurements Using Phase Contrast Vastly Undersampled Isotropic Projection Imaging (PC-VIPR) in a Canin Model, Med. Phys. Univ. of WI. Madison WI.

C.A. Mistretta et al, Highly Constrained Backprojection for Time-Resolved MRI, Mag. Reson. Med. 55:30-40 (2006).

Zhi-Pei Liang et al, Constrained Reconstruction Methods in MR Imaging, Reviews of Mag. Reson. in Med. vol. 4, pp. 67-185, 1992.

J.G. Pipe et al, Spiral Projection Imaging: a new fast 3D trajectory, Proc. Intl. Soc. Mag. Reson. Med. 13, (2005).

K.V. Koladia et al, Rapid 3D PC-MRA using Spiral Projection Imaging, Proc. Intl. Soc. Mag. Reson. Med. 13, (2005).

J. Tsao et al, k-t BLAST and k-t SENSE: Dynamic MRI With High Frame Rate Exploiting Spatiotemporal Correlations, Mag. Reson. Med. 50:1031-1042 (2003).

Zhi-Pei Liang et al, Constrained Imaging-Overcoming the Limitations of the Fourier Series, IEEE Engineering in Medicine and Biology, Sep./Oct. 1996, pp. 126-132.

Zhi-Pei Liang et al, Fast Algorithm for GS-Model-Based Image Reconstruction in Data-Sharing Fourier Imaging, IEEE Transactions on Med. Imaging, vol. 22, No. 8, pp. 1026-1030, Aug. 2003.

Klass P. Pruessmann et al, Advances in Sensitivity Encoding With Arbitrary k-Space Trajectories, Mag. Reson. in Med. 46:638-651 (2001).

R. Fahrig et al. Use of a C-Arm System to Generate True Three-dimensional Computed Rotational Angiograms: Preliminary In Vitro and In Vivo Results, AJNR: 18, pp. 1507-1514,Sep. 1997.

A.V. Barger, et al, Single Breath-Hold 3D Contrast-Enhanced Method for Assessment of Cardiac Function, Mag. Reson. in Med. 44:821-824 (2000).

J. Du et al, Time-Resolved Undersampled Projection Reconstruction Imaging for High-Resolution CE-MRA of the Distal Runoff Vessels, Mag. Reson. in Med. 48:516-522 (2002).

Ashwani Aggarwal et al, Imaging In Turbid Media by Modified Filtered Back Projection Method Using Data From Monte Carlo Simulation, Proc. of SPIE vol. 5047, pp. 314-324.

Xavier Golay, et al, Presto-Sense: An Ultrafast Whole-Brain fMRI Technique, Mag. Reson. in Med. 43:779-786 (2000).

Roland R. Price, et al, Practical Aspects of Functional MRI (NMR Task Group #6), Medical Physics, vol. 29, No. 8, pp. 1892-1912, Aug. 2002.

M.S. Hansen et al, k-t Blast Reconstruction From Arbitrary k-t space Sampling: Application To Dynmaic Radial Imaging, Proc. Intl. Soc. Mag. Reson. Med. 13 p. 684 (2005).

\* cited by examiner

DIFFUSION TENSOR IMAGING USING HIGHLY CONSTRAINED IMAGE RECONSTRUCTION METHOD

CROSS-REFERENCE TO RELATED APPLICATIONS

This application is based on U.S. Provisional Patent Application Ser. No. 60/719,445 filed on Sep. 22, 2005 and entitled "HIGHLY CONSTRAINED IMAGE RECONSTRUCTION METHOD" and Provisional Patent Application Ser. No. 60/774,314 filed on Feb. 17, 2006 and entitled "DIFFUSION TENSOR IMAGING USING HIGHLY CONSTRAINED IMAGE RECONSTRUCTION METHOD."

STATEMENT REGARDING FEDERALLY SPONSORED RESEARCH

This invention was made with government support under Grant No. HL06488, HL072260 and MH062015 awarded by the National Institute of Health. The United States Government has certain rights in this invention.

BACKGROUND OF THE INVENTION

The field of the invention is magnetic resonance imaging (MRI) and particularly, methods for acquiring and reconstructing diffusion weighted images.

Magnetic resonance imaging uses the nuclear magnetic resonance (NMR) phenomenon to produce images. When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins, and after the excitation signal $B_1$ is terminated, this signal may be received and processed to form an image.

When utilizing these signals to produce images, magnetic field gradients ($G_x$ $G_y$ and $G_z$) are employed. Typically, the region to be imaged is scanned by a sequence of measurement cycles in which these gradients vary according to the particular localization method being used. Each measurement is referred to in the art as a "view" and the number of views determines the quality of the image. The resulting set of received NMR signals, or views, or k-space samples, are digitized and processed to reconstruct the image using one of many well known reconstruction techniques. The total scan time is determined in part by the length of each measurement cycle, or "pulse sequence", and in part by the number of measurement cycles, or "views," that are acquired for an image. There are many clinical applications where total scan time for an image of prescribed resolution and SNR is a premium, and as a result, many improvements have been made with the objective of reducing scan time.

Figure 2:
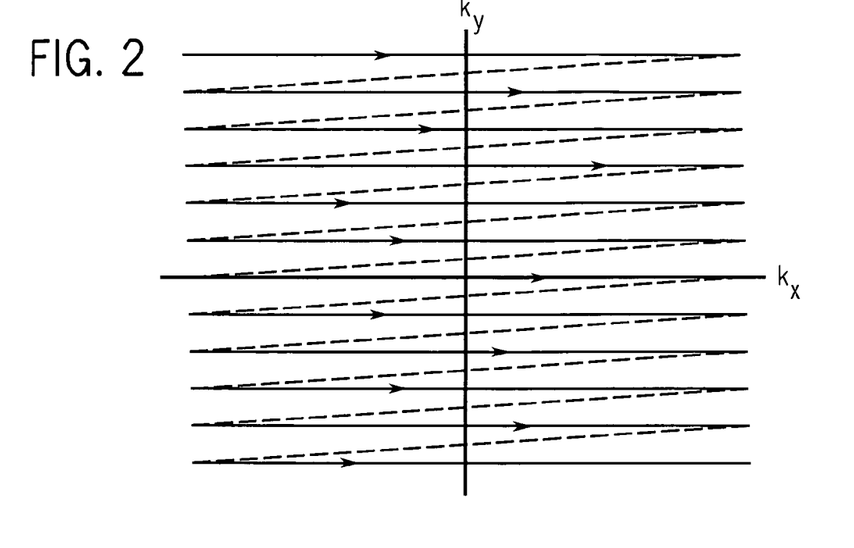
FIG. 2 is a graphic illustration of the manner in which k-space is sampled during a typical Fourier, or spin-warp, image acquisition using an MRI system.
Figure 3:
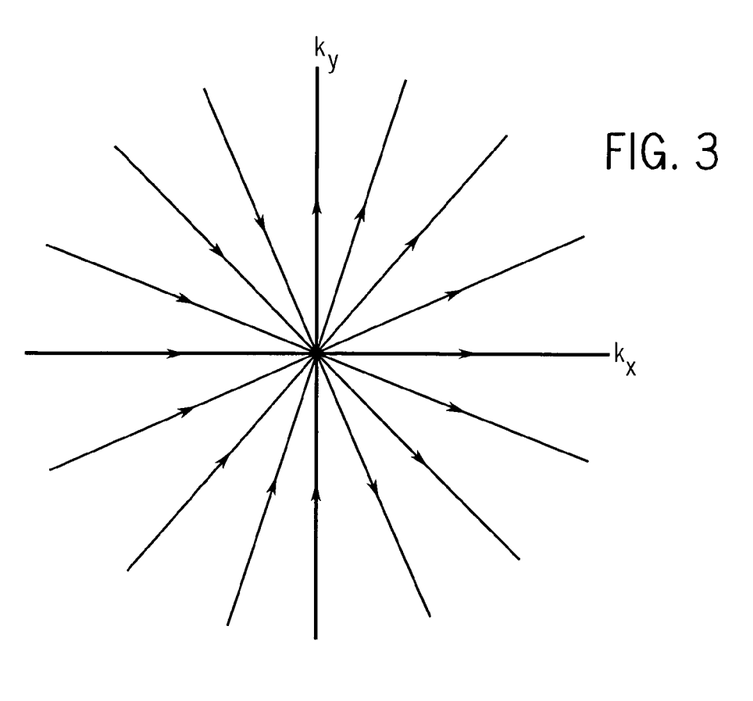
FIG. 3 is a graphic illustration of the manner in which k-space is sampled during a typical projection reconstruction image acquisition using an MRI system.

Recent work directed towards reducing total scan time includes using projection reconstruction methods as disclosed in U.S. Pat. No. 6,487,435. Projection reconstruction methods have been known since the inception of magnetic resonance imaging. Rather than sampling k-space in a rectilinear, or Cartesian, scan pattern as is done in Fourier imaging and shown in FIG. 2, projection reconstruction methods sample k-space with a series of views that sample radial lines extending outward from the center of k-space as shown in FIG. 3. The number of views needed to sample k-space determines the length of the scan and if an insufficient number of views are acquired, streak artifacts are produced in the reconstructed image. The technique disclosed in U.S. Pat. No. 6,487,435 is one method for reducing such streaking by acquiring successive undersampled images with interleaved views and sharing peripheral k-space data between successive image frames.

There are two methods used to reconstruct images from an acquired set of projection views as described, for example, in U.S. Pat. No. 6,710,686. In MRI the most common method is to regrid the k-space samples acquired on their radial sampling trajectories to a Cartesian grid. The image is then reconstructed by performing a 2D or 3D Fourier transformation of the regridded k-space samples. The second method for reconstructing an MR image is to transform the radial k-space projection views to Radon space by first Fourier transforming each projection view. An image is reconstructed from these signal projections by filtering and backprojecting them into the field of view (FOV) as is commonly done with x-ray CT data. As is well known in the art, if the acquired signal projections are insufficient in number to satisfy the Nyquist sampling theorem, streak artifacts are produced in the reconstructed image.

Figure 4:
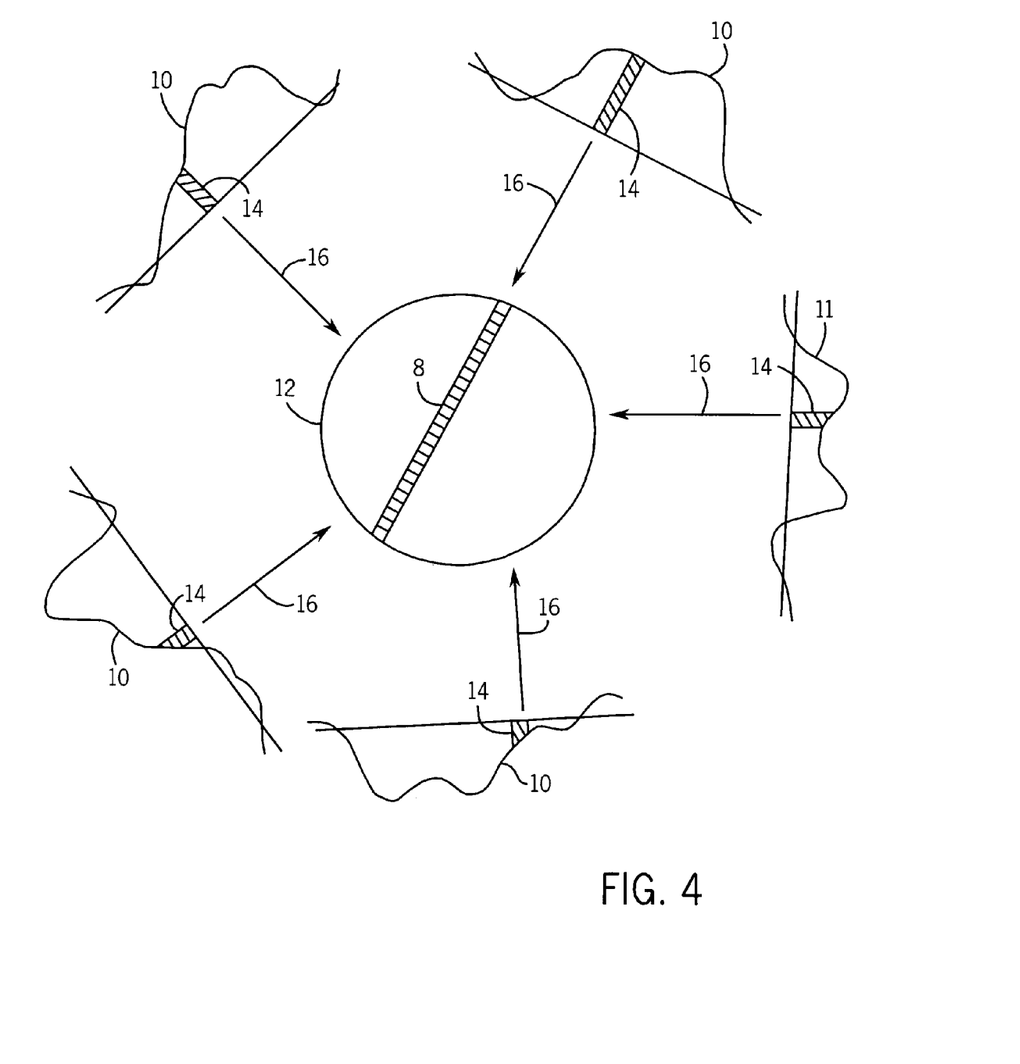
FIG. 4 is a pictorial representation of a conventional backprojection step in an image reconstruction process.

The standard backprojection method used in MRI is shown in FIG. 4. Each acquired signal projection profile 10 is backprojected onto the field of view 12 by projecting each signal sample 14 in the profile 10 through the FOV 12 along the projection path as indicted by arrows 16. In projecting each signal sample 14 in the FOV 12 we have no a priori knowledge of the subject being imaged and the assumption is made that the NMR signals in the FOV 12 are homogeneous and that the signal sample 14 should be distributed equally in each pixel through which the projection path passes. For example, a projection path 8 is illustrated in FIG. 3 for a single signal sample 14 in one signal projection profile 10 as it passes through N pixels in the FOV 12. The signal value (P) of this signal sample 14 is divided up equally between these N pixels:

$$S_n = (P \times 1)/N \quad (1)$$

where: $S_n$ is the signal value distributed to the $n^{th}$ pixel in a projection path having N pixels.

Clearly, the assumption that the backprojected signal in the FOV 12 is homogeneous is not correct. However, as is well known in the art, if certain corrections are made to each signal profile 10 and a sufficient number of profiles are acquired at a corresponding number of projection angles, the errors caused by this faulty assumption are minimized and image artifacts are suppressed. In a typical, filtered backprojection method of image reconstruction, 400 projections are required for a 256×256 pixel 2D image and 203,000 projections are required for a 256×256×256 voxel 3D image. If the method described in the above-cited U.S. Pat. No. 6,487,435 is employed, the number of projection views needed for these same images can be reduced to 100 (2D) and 2000 (3D).

Nerve tissue in human beings and other mammals includes neurons with elongated axonal portions arranged to form neural fibers or fiber bundles along which electrochemical signals are transmitted. In the brain, for example, functional areas defined by very high neural densities are typically linked by structurally complex neural networks of axonal fiber bundles. The axonal fiber bundles and other fibrous material are substantially surrounded by other tissue.

Diagnosis of neural diseases, planning for brain surgery, and other neurologically related clinical activities as well as research activities on brain functioning can benefit from non-invasive imaging and tracking of the axonal fibers and fiber bundles. In particular, diffusion tensor magnetic resonance imaging (DT-MRI) such as that disclosed in U.S. Pat. Nos. 6,526,305; 6,642,7126 and 6,806,705 has been shown to provide image contrast that correlates with axonal fiber bundles.

In the DT-MRI technique, motion sensitizing magnetic field gradients are applied in a so-called diffusion weighted imaging (DWI) pulse sequence so that the magnetic resonance images include contrast related to the diffusion of water or other fluid molecules. By applying the diffusion gradients in selected directions during the MRI measurement cycle, diffusion weighted images are acquired from which apparent diffusion tensor coefficients are obtained for each voxel location in the reconstructed image. Fluid molecules diffuse more readily along the direction of the axonal fiber bundle as compared with directions partially or totally orthogonal to the fibers. Hence, the directionality and anisotropy of the apparent diffusion coefficients tend to correlate with the direction of the axonal fibers and fiber bundles. Using iterative tracking methods, axonal fibers or fiber bundles can be tracked or segmented using the DT-MRI data.

However, to calculate the apparent diffusion tensor coefficients, it is necessary to acquire at least six DWI images using motion-sensitizing gradients directed in six different directions. Indeed, it is desirable to acquire more than six directions, but the acquisition of additional DWI images extends the total scan time beyond what is already a lengthy scan.

SUMMARY OF THE INVENTION

The present invention is a method for acquiring diffusion weighted image data at many different motion-sensitizing directions in a vastly reduced scan time and reconstructing corresponding DWI images from the acquired data. A composite image is reconstructed using interleaved projection views motion-sensitized in different directions, and this composite image is employed in a highly constrained backprojection reconstruction method to reconstruct each DWI image from projection views that are motion-sensitized in a single direction. DWI images can thus be acquired with far fewer views without producing clinically objectionable image artifacts due to undersampling.

Figure 5:
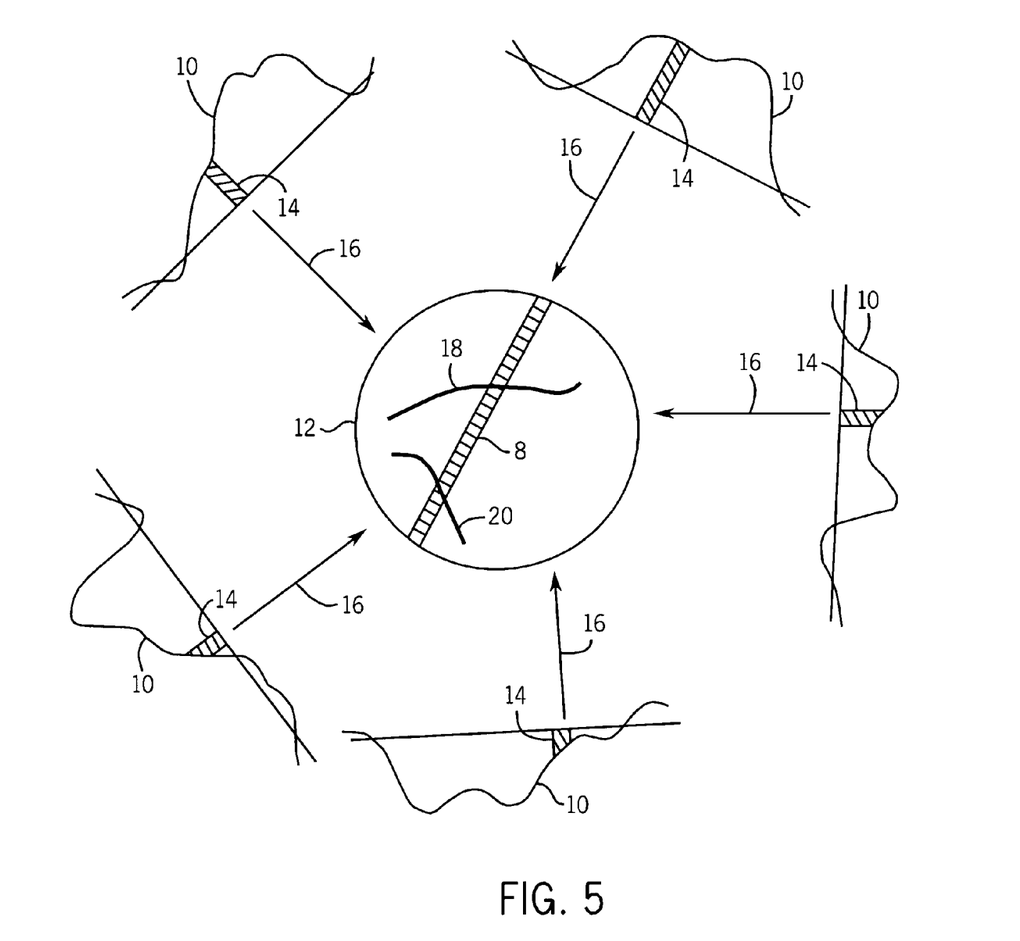
FIG. 5 is a pictorial representation of the same step as implemented according to the present invention.

A discovery of the present invention is that good quality images can be produced with far fewer projection signal profiles if a priori knowledge of the signal contour in the FOV 12 is used in the reconstruction process. Referring to FIG. 5, for example, the signal contour in the FOV 12 may be known to include structures 18 and 20. That being the case, when the backprojection path 8 passes through these structures a more accurate distribution of the signal sample 14 in each pixel is achieved by weighting the distribution as a function of the known signal contour at that pixel location. As a result, a majority of the signal sample 14 will be distributed in the example of FIG. 5 at the pixels that intersect the structures 18 and 20. For a backprojection path 8 having N pixels this highly constrained backprojection may be expressed as follows:

$$S_n = (P \times C_n) / \sum_{n=1}^{N} C_n \qquad (2)$$

where: P=the backprojected signal sample value in the projection profile; and $C_n$=signal value of an a priori composite image at the $n^{th}$ pixel along the backprojection path.

The numerator in equation (2) weights each pixel using the corresponding signal value in the composite image and the denominator normalizes the value so that all backprojected signal samples reflect the projection sums for the time frame and are not multiplied by the sum of the composite image. It should be noted that while the normalization can be performed on each pixel separately after the backprojection is performed, in many clinical applications it is far easier to normalize the projection P before the backprojection. In this case, the projection P is normalized by dividing by the corresponding value $P_c$ in a projection through the composite image at the same view angle. The normalized projections $P/P_c$ are then backprojected and the resulting image is then multiplied by the composite image.

Figure 6:
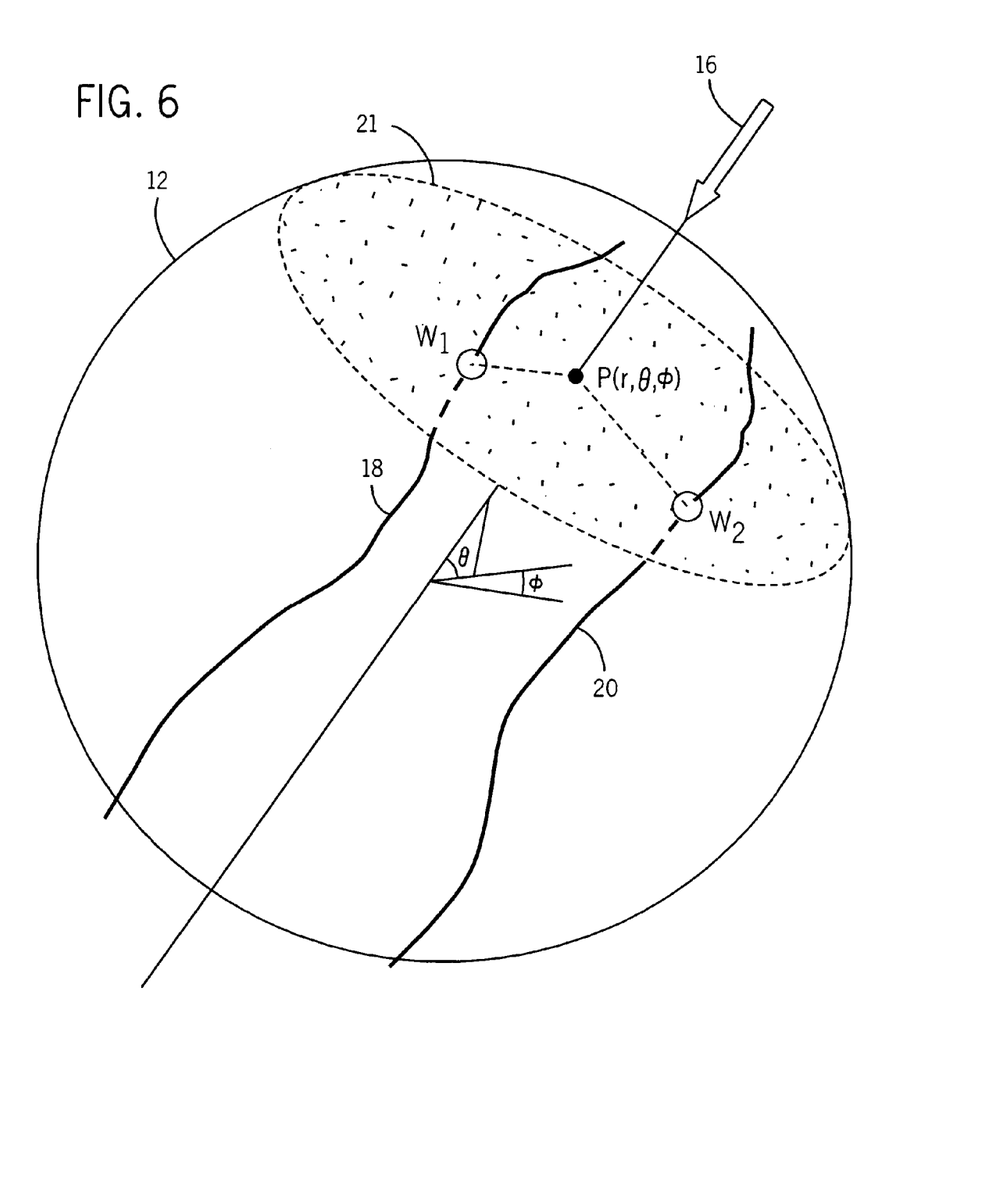
FIG. 6 is a pictorial representation of a highly constrained backprojection step in the reconstruction of a 3D image.

A 3D embodiment is shown graphically in FIG. 6 for a single 3D projection view characterized by the view angles θ and φ. This projection view is back projected along axis 16 and spread into a Radon plane 21 at a distance r along the back projection axis 16. Instead of a filtered back projection in which projection signal values are filtered and uniformly distributed into the successive Radon planes, along axis 16, the projection signal values are distributed in the Radon plane 21 using the information in the composite image. The composite image in the example of FIG. 5A contains structures 18 and 20. The weighted signal contour value is deposited at image location x, y, z in the Radon plane 21 based on the intensity at the corresponding location x, y, z in the composite image. This is a simple multiplication of the signal profile value by the corresponding composite image voxel value. This product is then normalized by dividing the product by the profile value from the corresponding image space profile formed from the composite image. The formula for the 3D reconstruction is $$I(x,y,z) = \Sigma (P(r,\theta,\phi) * C(x,y,z)_{(r,\theta,\phi)} / P_c(r,\theta,\phi)) \qquad (3)$$

where the sum (Σ) is over all projections in the image frame being reconstructed and the x, y, z values in a particular Radon plane are calculated using the profile value P(r,θ,φ) at the appropriate r,θ,φ value for that plane. $P_c(r,\theta,\phi)$ is the corresponding profile value from the composite image, and $C(x,y,z)_{r,\theta,\phi}$ is the composite image value at (r,θ,φ).

Figure 7:
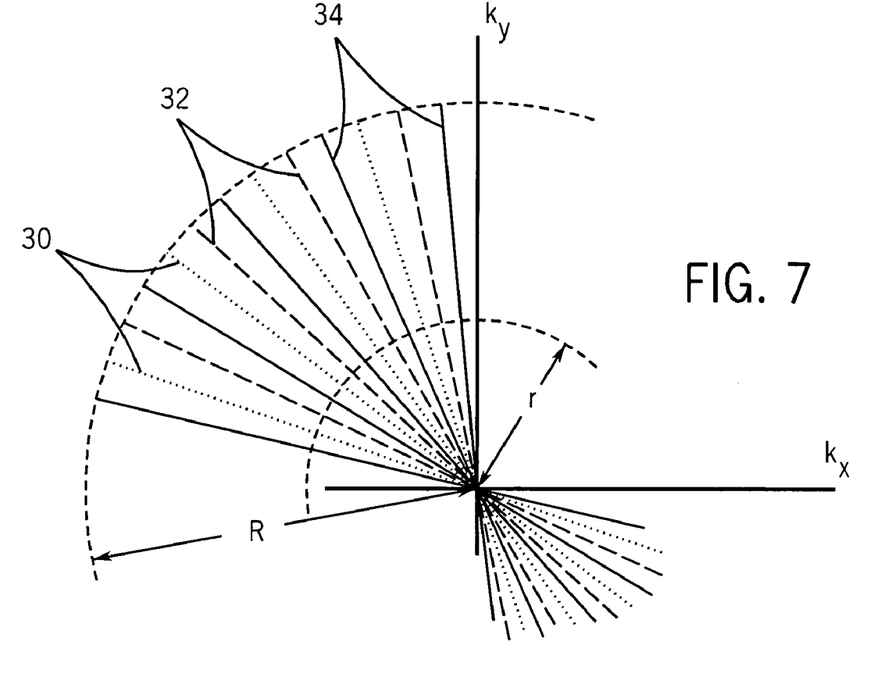
FIG. 7 is a graphic representation of interleaved projection view k-space sampling pattern.

Another discovery of the present invention is that a priori information is available in a diffusion weighted imaging procedure and a composite image can be reconstructed and used to constrain the reconstruction of undersampled images in each motion sensitizing direction. When a series of motion sensitized images are acquired in a DWI study, for example, each image frame may be reconstructed using a very limited set of acquired views. However, after a number of motion sensitized images have been acquired with views at interleaved projection angles, a sufficient number of different views are available to reconstruct a quality composite image for use according to the present invention. This is illustrated in FIG. 7, where dotted lines 30 indicate projection views acquired in one motion-sensitized image, dashed lines 32 indicate interleaved projection views acquired in a second motion-sensitized image, and lines 34 indicate interleaved projection views acquired in a third motion-sensitized image. Whereas the sampling density necessary to meet the Nyquist criteria may extend only a short radial distance (r) for any one of these images, by combining the interleaved projection profiles of all three images this distance is effectively extended to the radius R with a resulting reduction in image artifacts.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE PREFERRED EMBODIMENT

Figure 1:
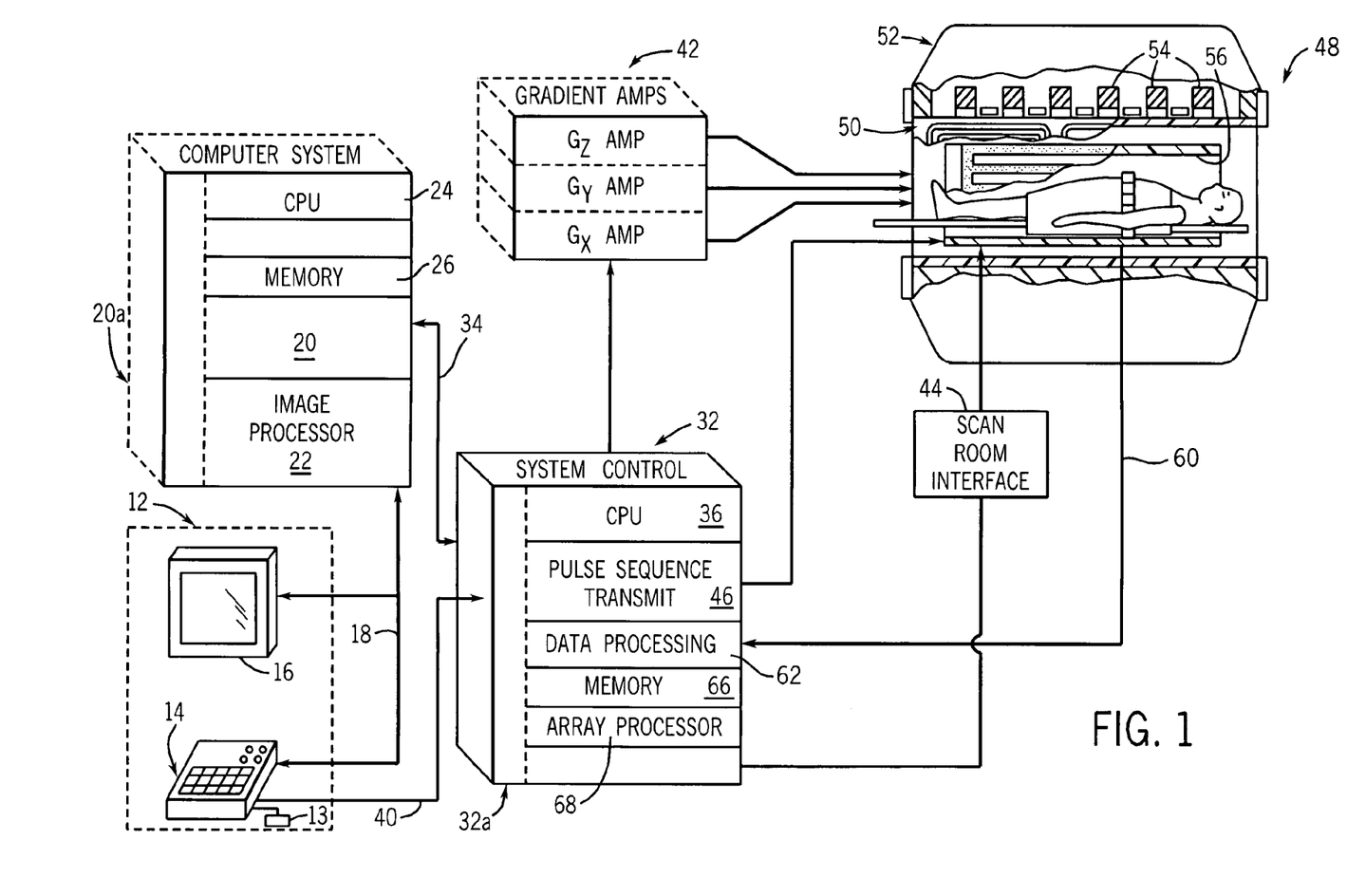
FIG. 1 is a block diagram of an MRI system used in the preferred embodiment of the invention.

Referring particularly to FIG. 1, the preferred embodiment of the invention is employed in an MRI system. The MRI system includes a workstation 110 having a display 112 and a keyboard 114. The workstation 110 includes a processor 116 which is a commercially available programmable machine running a commercially available operating system. The workstation 10 provides the operator interface which enables scan prescriptions to be entered into the MRI system.

The workstation 110 is coupled to four servers: a pulse sequence server 118; a data acquisition server 120; a data processing server 122, and a data store server 23. In the preferred embodiment the data store server 23 is performed by the workstation processor 116 and associated disc drive interface circuitry. The remaining three servers 118, 120 and 122 are performed by separate processors mounted in a single enclosure and interconnected using a 64-bit backplane bus. The pulse sequence server 118 employs a commercially available microprocessor and a commercially available quad communication controller. The data acquisition server 120 and data processing server 122 both employ the same commercially available microprocessor and the data processing server 122 further includes one or more array processors based on commercially available parallel vector processors.

The workstation 10 and each processor for the servers 118, 120 and 122 are connected to a serial communications network. This serial network conveys data that is downloaded to the servers 118, 120 and 122 from the workstation 110 and it conveys tag data that is communicated between the servers and between the workstation and the servers. In addition, a high speed data link is provided between the data processing server 122 and the workstation 110 in order to convey image data to the data store server 23.

The pulse sequence server 118 functions in response to program elements downloaded from the workstation 110 to operate a gradient system 24 and an RF system 26. Gradient waveforms necessary to perform the prescribed scan are produced and applied to the gradient system 24 which excites gradient coils in an assembly 28 to produce the magnetic field gradients $G_x$, $G_y$ and $G_z$ used for position encoding NMR signals. The gradient coil assembly 28 forms part of a magnet assembly 30 which includes a polarizing magnet 32 and a whole-body RF coil 34.

RF excitation waveforms are applied to the RF coil 34 by the RF system 26 to perform the prescribed magnetic resonance pulse sequence. Responsive NMR signals detected by the RF coil 34 are received by the RF system 26, amplified, demodulated, filtered and digitized under direction of commands produced by the pulse sequence server 118. The RF system 26 includes an RF transmitter for producing a wide variety of RF pulses used in MR pulse sequences. The RF transmitter is responsive to the scan prescription and direction from the pulse sequence server 118 to produce RF pulses of the desired frequency, phase and pulse amplitude waveform. The generated RF pulses may be applied to the whole body RF coil 34 or to one or more local coils or coil arrays.

The RF system 26 also includes one or more RF receiver channels. Each RF receiver channel includes an RF amplifier that amplifies the NMR signal received by the coil to which it is connected and a quadrature detector which detects and digitizes the I and Q quadrature components of the received NMR signal. The magnitude of the received NMR signal may thus be determined at any sampled point by the square root of the sum of the squares of the I and Q components:

$$M=\sqrt{I^2+Q^2},$$

and the phase of the received NMR signal may also be determined:

$$\phi=\tan^{-1}Q/I.$$

The pulse sequence server 118 also optionally receives patient data from a physiological acquisition controller 36. The controller 36 receives signals from a number of different sensors connected to the patient, such as ECG signals from electrodes or respiratory signals from a bellows. Such signals are typically used by the pulse sequence server 118 to synchronize, or "gate", the performance of the scan with the subject's respiration or heart beat.

The pulse sequence server 118 also connects to a scan room interface circuit 38 which receives signals from various sensors associated with the condition of the patient and the magnet system. It is also through the scan room interface circuit 38 that a patient positioning system 40 receives commands to move the patient to desired positions during the scan.

It should be apparent that the pulse sequence server 118 performs real-time control of MRI system elements during a scan. As a result, it is necessary that its hardware elements be operated with program instructions that are executed in a timely manner by run-time programs. The description components for a scan prescription are downloaded from the workstation 110 in the form of objects. The pulse sequence server 118 contains programs which receive these objects and converts them to objects that are employed by the run-time programs.

The digitized NMR signal samples produced by the RF system 26 are received by the data acquisition server 120. The data acquisition server 120 operates in response to description components downloaded from the workstation 110 to receive the real-time NMR data and provide buffer storage such that no data is lost by data overrun. In some scans the data acquisition server 120 does little more than pass the acquired NMR data to the data processor server 122. However, in scans which require information derived from acquired NMR data to control the further performance of the scan, the data acquisition server 120 is programmed to produce such information and convey it to the pulse sequence server 118. For example, during prescans NMR data is acquired and used to calibrate the pulse sequence performed by the pulse sequence server 118. Also, navigator signals may be acquired during a scan and used to adjust RF or gradient system operating parameters or to control the view order in which k-space is sampled. And, the data acquisition server 120 may be employed to process NMR signals used to detect the arrival of contrast agent in an MRA scan. In all these examples the data acquisition server 120 acquires NMR data and processes it in real-time to produce information which is used to control the scan.

The data processing server 122 receives NMR data from the data acquisition server 120 and processes it in accordance with description components downloaded from the workstation 110. Such processing may include, for example: Fourier transformation of raw k-space NMR data to produce two or three-dimensional images; the application of filters to a reconstructed image; the performance of a backprojection image reconstruction of acquired NMR data; the calculation of functional MR images; the calculation of motion or flow images, etc.

Images reconstructed by the data processing server 122 are conveyed back to the workstation 110 where they are stored. Real-time images are stored in a data base memory cache (not shown) from which they may be output to operator display 112 or a display 42 which is located near the magnet assembly 30 for use by attending physicians. Batch mode images or selected real time images are stored in a host database on disc storage 44. When such images have been reconstructed and transferred to storage, the data processing server 122 notifies the data store server 23 on the workstation 110. The workstation 110 may be used by an operator to archive the images, produce films, or send the images via a network to other facilities.

Figure 8:
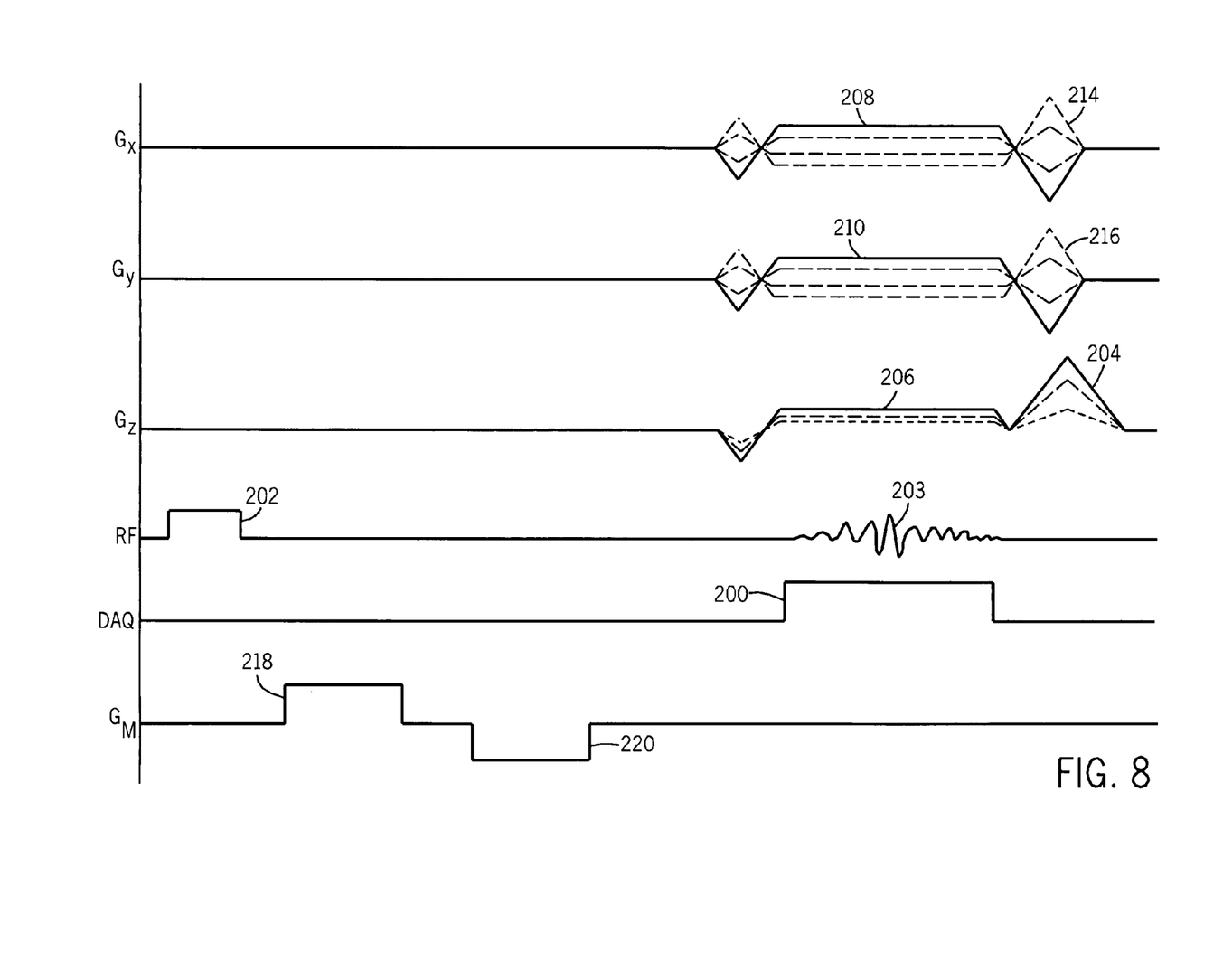
FIG. 8 is a preferred pulse sequence used by the MRI system of FIG. 1 to practice the present invention.

A pulse sequence used to acquire diffusion weighted data as 3D projections is shown in FIG. 8. The sequence is implemented on the above described MRI system equipped with a high-performance gradient subsystem (40 mT/m maximum amplitude and 150 T/m/sec maximum slew rate). Either full-echo or partial-echo readouts can be performed during a data acquisition window 200. If partial echo is chosen, the bottom half of k-space ($k_z<0$) is only partially acquired. Because of the large FOV in all directions, a non-selective radio-frequency (RF) pulse 202 can be used to produce transverse magnetization throughout the image FOV.

A gradient-recalled NMR echo signal 203 is produced by spins in the excited FOV and acquired in the presence of three readout gradients 206, 208 and 210. Since a slab-select gradient is not required, the readout gradient waveforms $G_x$, $G_y$, and $G_z$ have a similar form. This symmetry is interrupted only by the need to spoil the sequence, which is accomplished by playing a dephasing gradient lobe 204 at the end of the sequence along one gradient axis. The $G_x$ and $G_y$ readout gradients 208 and 210 are rewound by respective gradient pulses 212 and 214 to achieve steady state.

The readout gradient waveforms $G_x$, $G_y$ and $G_z$ are modulated during the scan to sample radial trajectories at different view angles. The angular spacing is chosen such that a uniform distribution of k-space sample points occurs at the peripheral boundary ($k_{max}$) of the sampled k-space sphere. Although several methods of calculating the distribution are known, a method which evenly distributes the projections by sampling the spherical surface with a spiral trajectory, with the conditions of constant path velocity and surface area coverage is used. This solution also has the benefit of generating a continuous sample path, which reduces gradient switching and eddy currents. For N total projections, the equations for the gradient amplitude as a function of projection number n are:

$$G_z = \frac{2n-1}{2N} \tag{4}$$

$$G_x = \cos(\sqrt{2N\pi}\sin^{-1}G_z(n))\sqrt{1-G_z(n)^2} \tag{5}$$

$$G_y = \cos(\sqrt{2N\pi}\sin^{-1}G_z(n))\sqrt{1-G_z(n)^2}. \tag{6}$$

A series of N pulse sequences are performed where N determines the sampling density to be achieved during the scan. The readout gradient amplitudes for the $n^{th}$ pulse sequence in this series is given by equations (4), (5) and (6). While n can be indexed from 1 to N in monotonic order during the scan, it can be appreciated that other orders are possible.

To diffusion weight the acquired echo signal 203 a large motion encoding gradient $G_M$ is applied after excitation of spin magnetization and prior to signal acquisition. The motion encoding gradient $G_M$ is a bipolar gradient having two lobes 218 and 220 of equal area. As is well known in the art, the area of the lobes 218 and 220 and their spacing determines the sensitivity of the gradient $G_M$ to spin motion and the direction of the gradient $G_M$ determines the motion sensitizing direction. The gradient $G_M$ is produced by a combination of the logical gradients $G_x$, $G_y$ and $G_z$ that produce the desired direction. To perform diffusion tensor imaging separate images sensitized in at least six different directions must be acquired and in the preferred embodiment twelve different motion-sensitizing directions are acquired. It is the need to acquire so many separate images that drives up the total scan time for this procedure and produces the need for the present invention.

This pulse sequence is easily adapted to acquire two-dimensional images. As described for example in U.S. Pat. No. 6,630,824 one of the readout gradient waveforms may be replaced with a slice select gradient waveform and the two remaining readout gradients are played out during the scan to acquire evenly spaced radial trajectories in 2D k-space.

It should be apparent to those skilled in the art that sampling trajectories other than the preferred straight line trajectory extending from one point on the k-space peripheral boundary, through the center of k-space to an opposite point on the k-space peripheral boundary may also be used. As mentioned above, one variation is to acquire a partial NMR echo signal 203 which samples along a trajectory that does not extend across the entire extent of the sampled k-space volume. Another variation which is equivalent to the straight line projection reconstruction pulse sequence is to sample along a curved path rather than a straight line. Such pulse sequences are described, for example, in "Fast Three Dimensional Sodium Imaging", MRM, 37:706-715, 1997 by F. E. Boada, et al. and in "Rapid 3D PC-MRA Using Spiral Projection Imaging", Proc. Intl. Soc. Magn. Reson. Med. 13 (2005) by K. V. Koladia et al and "Spiral Projection Imaging: a new fast 3D trajectory", Proc. Intl. Soc. Mag. Reson. Med. 13 (2005) by J. G. Pipe and Koladia. It should also be apparent that the present invention may be employed with 2D as well as 3D versions of these sampling methods and use of the term "pixel" is intended to refer to a location in either a 2D or a 3D image.

Figure 9:
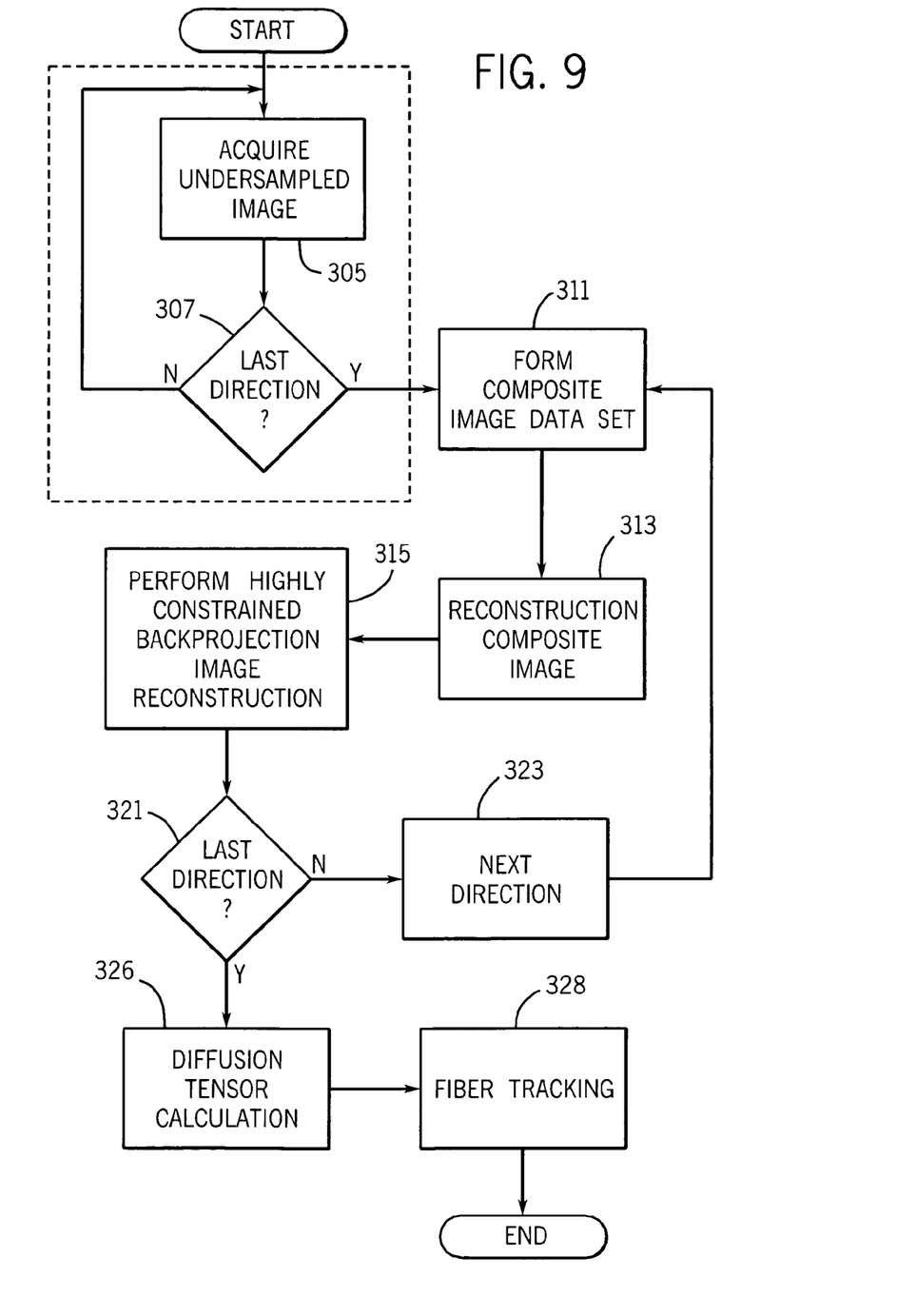
FIG. 9 is a flow chart of the steps used by the MRI system of FIG. 1 to practice the preferred embodiment of the invention.

Referring particularly to FIG. 9, the diffusion tensor MRI procedure begins by acquiring the necessary diffusion weighted images as indicated generally by the steps within dotted line 301. The pulse sequence described above is used in the MRI system of FIG. 1 and a loop is entered in which a series of highly undersampled DWI images are acquired at the respective motion-sensitizing directions (directions 1–m). As indicated at process block 305, each DWI image is acquired with the above described pulse sequence, but far fewer views are acquired than suggested by the Nyquist criteria. In the preferred embodiment m=12 different motion-sensitizing directions are to be acquired and each undersampled DWI image is acquired with N/m views, where N is the number of views of a fully sampled DWI image. In the 2D embodiment, therefore, N/m=408/12=34 projection views are acquired and in the 3D embodiment N/m=211,000/12=17,617 views are acquired. The projection views for each DWI image are directed such that k-space is sampled as uniformly as possible, albeit highly undersampled. Most importantly, the projection views acquired for each undersampled DWI image are interleaved with all the projection views acquired for the other undersampled DWI images. As a result, when the last undersampled DWI image has been acquired, as determined at decision block 307, k-space has been fully sampled with m=12 different motion-sensitizing gradients.

This completes the DWI data acquisition phase of the process and image reconstruction begins. This can be done in the data processing server 22 of the MRI system of FIG. 1, or the k-space data sets can be off-loaded to a separate workstation to free up the MRI system for the next patient. It should be apparent that the patient scan time has been substantially reduced to the scan time needed to acquire one fully sampled image even though m=12 different motion-sensitizing directions have been acquired.

Referring still to FIG. 9, a loop is then entered in which a DWI image is reconstructed for each acquired, undersampled k-space image data set. The first step in the image reconstruction process is to form a composite image k-space data set as indicated at process block 311. This is done by combining the k-space projection data for the direction being reconstructed along with the k-space projection data acquired for the closest motion-sensitizing directions. A composite image is then reconstructed with this data set as indicated at process block 313. This reconstruction is done with a conventional image reconstruction method and in the preferred embodiment this reconstruction includes regridding the k-space samples into Cartesian coordinates and then performing a 2D or 3D inverse Fourier transformation.

Figure 10:
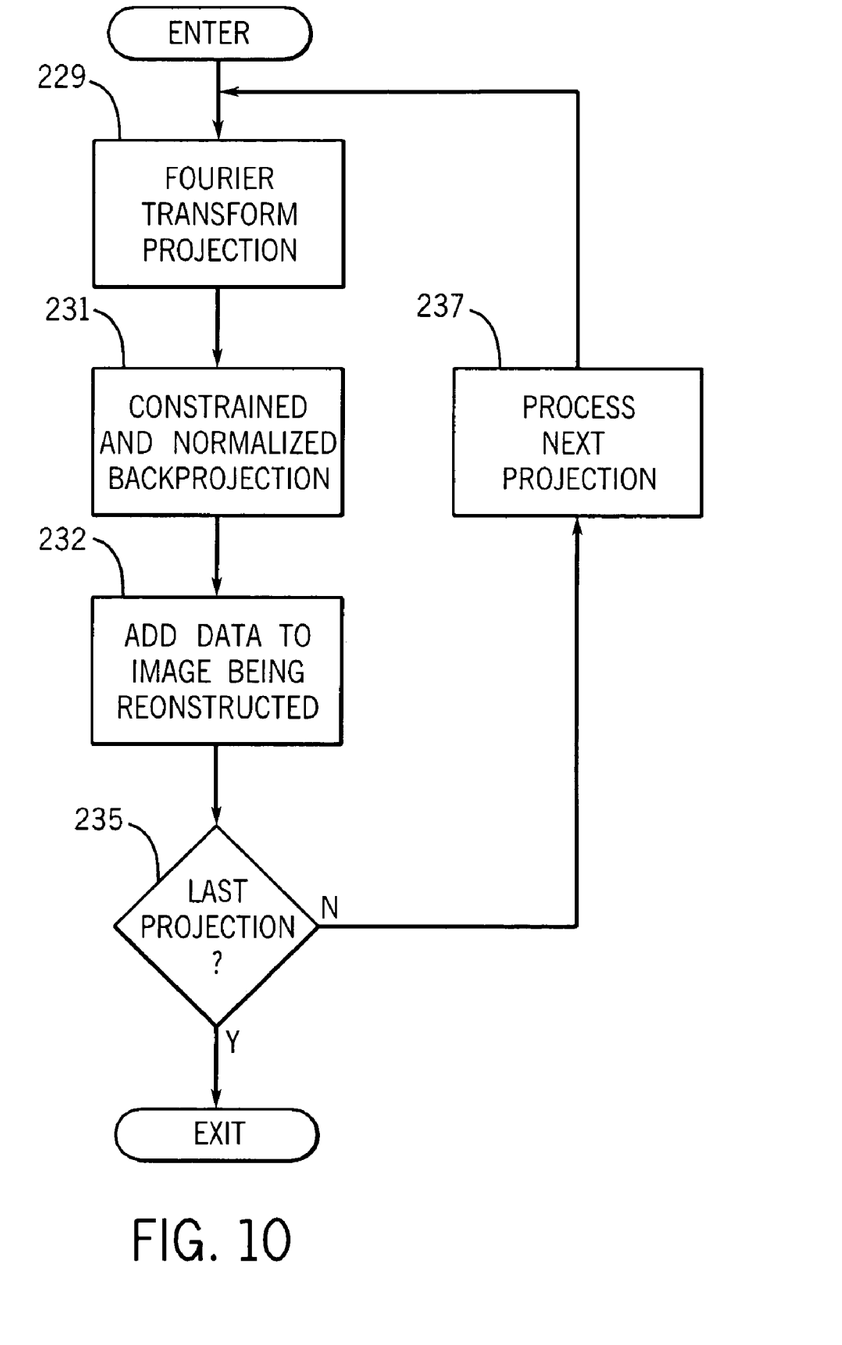
FIG. 10 is a flow chart of an image reconstruction method used in the method of FIG. 9.

A diffusion weighted image (DWI) is then reconstructed. This is done using the highly constrained backprojection method indicated at process block 315. Referring to FIG. 10, this highly constrained backprojection reconstruction step includes, a loop in which each projection view in the acquired k-space data set for the current motion-sensitized direction is backprojected. The k-space projection view is first transformed to Radon space by performing a fast Fourier inverse transformation as indicated at process block 229. The transformed projection is then backprojected as indicated at process block 231. This backprojection is performed as described above in equation (2) for 2D or equation (3) for 3D and using the reconstructed composite image. This is a highly constrained backprojection and normalization step that is described in detail above with reference to FIGS. 5 and 6. As indicated at process block 233, the resulting backprojected values are added to the direction image being reconstructed and a test is made at decision block 235 to determine if all of the projection views have been backprojected for the current DWI image. If not, the next projection is processed as indicated at process block 237.

Referring again to FIG. 9, the image reconstruction process continues to produce DWI images for each acquired motion-sensitized direction until DWI images for all m=12 of the prescribed directions have been produced as determined at decision block 321. Otherwise, the next direction image is processed as indicated at process block 323. It should be noted that in this embodiment of the invention a composite image is formed for each DWI direction image using less than all the acquired interleaved projection views.

As indicated at process block 326, after all the DWI images are reconstructed, they are processed to produce the diffusion tensor calculations. In the diffusion tensor calculation, the intensity of each diffusion-weighted image pixel is fitted to calculate six independent variables in a 3×3 diffusion tensor. The diffusion tensor is then diagonalized to obtain three eigen values and three eigen vectors. The images representing the properties of the fibers are than determined by further computer processing of the six values.

As indicated by process block 328, these fiber property images are then used in an interactive fiber tracking process. The user initiates the process by selecting a pixel in an anatomic image of the subject. The tracking process involves pixel connecting and ultimately making a decision based on the fiber properties as to when the ends of the fiber containing the selected pixel are reached. This fiber tracking process and the diffusion tensor calculations are well known in the art and reference is made to the above cited U.S. Pat. Nos. 6,614,226; 6,526,305; 6,642,716 and 6,806,705 for a more detailed description of these processes.

Figure 11:
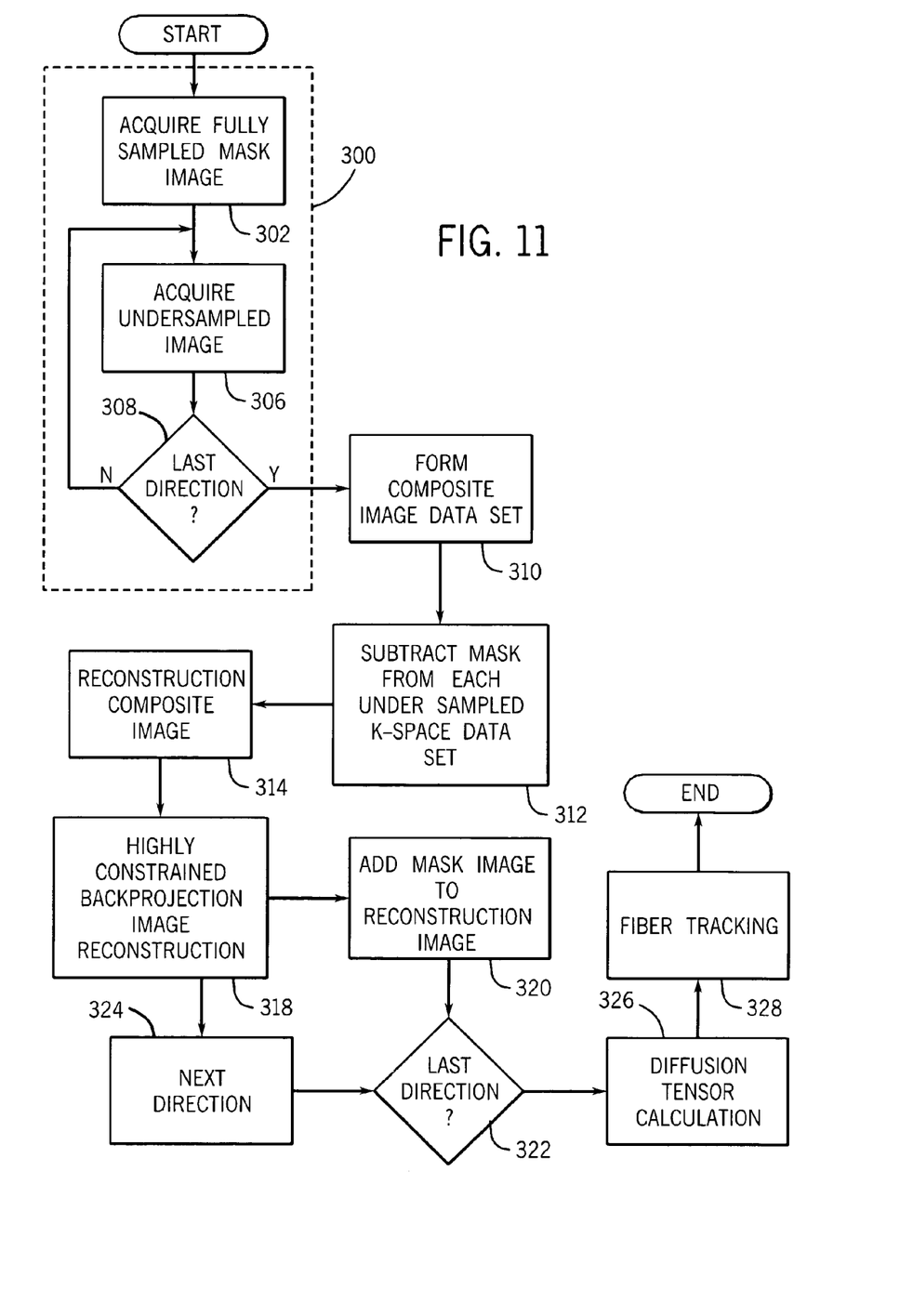
FIG. 11 is a flow chart of the steps used to practice a second embodiment of the invention.

There are alternative ways in which the present invention may be used to produce diffusion weighted images. Referring particularly to FIG. 11, the diffusion tensor MRI procedure in this second embodiment begins by acquiring the necessary diffusion weighted images as indicated generally by dotted line 300. The pulse sequence described above is used in the MRI system of FIG. 1 and the first step indicated at process block 302 is to acquire a fully sampled "mask" image at one of the chosen motion-sensitizing directions (direction 1). In the preferred embodiment N=408 views are acquired to satisfy the Nyquist criteria for a 256 by 256 pixel 2D image and N=100,000 views are acquired for a 3D image.

A loop is then entered in which a series of highly undersampled DWI images are acquired at the respective remaining motion-sensitizing directions (directions 2–m). As indicated at process block 306, each DWI image is acquired with the above described pulse sequence, but far fewer views are acquired than suggested by the Nyquist criteria. In the preferred embodiment m=12 different motion-sensitizing directions are to be acquired and each undersampled DWI image is acquired with N/m views, where N is the number of views of a fully sampled DWI image. In the 2D embodiment, therefore, N/m=408/12=34 projection views are acquired for each DWI image. These projection views are directed such that k-space is sampled as uniformly as possible, albeit highly undersampled. Most importantly, the projection views acquired for each undersampled DWI image are interleaved with all the projection views acquired for the other undersampled DWI images. As a result, when the last undersampled DWI image has been acquired, as determined at decision block 308, nearly all of k-space has been fully sampled for a second time.

This completes the DWI data acquisition phase of the process and image reconstruction begins. This can be done in the data processing server 22 of the MRI system of FIG. 1, or the k-space data sets can be off-loaded to a separate workstation to free up the MRI system for the next patient. It should be apparent that the patient scan time has been substantially reduced to the scan time needed to acquire two fully sampled images even though m=12 different motion-sensitizing directions have been acquired.

Referring still to FIG. 11, the first step in the image reconstruction process is to reconstruct the fully sampled k-space data set for direction 1 as indicated at process block 310. This direction 1 image is reconstructed with a conventional image reconstruction method and in the preferred embodiment this reconstruction includes regridding the k-space samples into Cartesian coordinates and then performing a 2D or 3D inverse Fourier transformation. The resulting image for direction 1 also serves as a "mask" image which is used in the processing described below.

Before reconstructing images for directions 2 through m, k-space data from mask direction 1 is subtracted as indicated at process block 312. This is done by subtracting projection views in the fully sampled direction 1 k-space data set from corresponding projection views at the same view angle in the undersampled k-space data sets for directions 2–m. This is done to create sparse k-space data sets that work better with the highly constrained backprojection method. As a result, undersampled "difference" k-space data sets (2–1, 3–1, 4–1, . . . , m–1) are produced for each of the motion-sensitizing directions.

A single, fully sampled composite image is produced next as indicated at process block 314. This is accomplished by first combining all of the k-space interleaved projection views in the difference k-space data sets (2–1, 3–1, . . . , m–1) and projection views from the direction 1 k-space data set to form a fully sampled k-space data set. A standard image reconstruction is then performed on this complete data set to produce the composite image. As indicated above, a regridding followed by an inverse Fourier transformation method is used in the preferred embodiment.

A loop is then entered in which the undersampled DWI images encoded at motion-sensitizing directions 2 through m are reconstructed. This is done using the highly constrained backprojection method of the present invention indicated at process block 318. This backprojection reconstruction is illustrated in greater detail in FIG. 10 as described above. The composite image is used along with the undersampled difference k-space data set for the current direction. After the difference DWI image has been reconstructed for a particular direction 2 through m, the previously reconstructed image for direction 1 is added thereto as indicated at process block 320. This is a pixel-by-pixel addition of the magnitudes in the two images and it restores the structures that were subtracted out prior to image reconstruction. The result is a diffusion weighted image that is sensitive to spin motion in one of the m prescribed directions.

The image reconstruction process continues to produce DWI images for each direction as indicated at process block 324 until DWI images for all of the prescribed directions have been produced as determined at decision block 322.

As described above, these DWI images are processed at 326 to produce fiber property images and these in turn are used in the fiber tracking process 328.

In the preferred embodiments described above, twelve different diffusion encoding directions are used. However, to produce higher resolution images that resolve complex fiber architectures or structures in tissues it is necessary to acquire diffusion weighted data sets that are motion encoded in hundreds of different directions. As indicated in the above-cited U.S. Pat. No. 6,614,226, for example, data sets for up to 400 different motion encoded directions may be acquired. In such cases the manner in which the composite images and mask images are formed in the methods described above is modified.

First, the mask image reconstructed at process block 310 (FIG. 11) is formed in a different manner, and its subtraction from the acquired undersampled k-space data sets at process block 312 is modified. Rather than using all the acquired projection views in the 100 or more motion encoded directions, only those projection views acquired with the motion encoding gradient directions immediately around the direction of the image frame being reconstructed are used in the mask. Enough are used that a quality mask image can be reconstructed with a state-of-the-art filtered backprojection method. Then, this reconstructed mask image is reprojected at the same view angles as those in the current image frame. These projected mask projection views are then subtracted from corresponding projection views in the current image frame to provide the desired "sparse" data set for the highly constrained backprojection reconstruction to follow.

In this embodiment, a different mask is used for each diffusion encoding direction.

Similarly, when a large number of different motion encoding gradient directions are acquired, the composite image is reconstructed in process block 314 from fewer than all the acquired projection views. As with the mask, projection views are employed that are acquired at motion encoded directions surrounding the direction of the current image frame. For example, if 100 different motion encoding directions are acquired, projection views from the closest surrounding 10 neighboring motion encoding gradients are employed. These are sufficient in number to enable a high quality composite image to be reconstructed.

As with the mask, a separate composite image is produced for each differently motion encoded image frame data set.

The invention claimed is:

1. A method for producing a set of diffusion weighted images of a subject positioned in a field of view (FOV) of a magnetic resonance imaging (MRI) system, the steps comprising:
   a) acquiring with the MRI system a set of projection views of the subject positioned in the FOV using a pulse sequence with a motion sensitizing gradient directed along a first direction the set of projection views forming an undersampled image data set;
   b) repeating step a) a plurality of times, wherein the motion sensitizing gradient is directed along a different direction each time and the projection views are all interleaved;
   c) producing a composite image with projection views from a plurality of the undersampled image data sets wherein a value at each composite image pixel indicates information about the subject positioned in the FOV;
   d) reconstructing a diffusion weighted image of the subject from each undersampled image data set by;
      d)i) backprojecting acquired projection views in the undersampled image data set into the FOV and weighting the value backprojected into each image pixel by the value of the corresponding pixel in the composite image; and
      d)ii) summing the backprojected values for each image pixel; and
   e) calculating a diffusion tensor from the diffusion weighted images.

2. The method as recited in claim 1 in which each image pixel backprojected value $S_n$ is calculated in step d)i) as $$S_n = (P \times C_n) / \sum_{n=1}^{N} C_n$$

where: P=the projection view value being backprojected;
   $C_n$=corresponding pixel value in the composite image;
   $S_n$=the value of the $n^{th}$ pixel along the backprojection path; and
   N=total number of pixels along the backprojection path.

3. The method as recited in claim 1 in which the FOV is three-dimensional, a three-dimensional image is produced, and the image $I_{(x,y,z)}$ reconstructed in step d) is:

$$I(x,y,z) = \Sigma(P(r,\theta,\phi) * C(x,y,z)_{(r,\theta,\phi)} / P_c(r,\theta,\phi)$$

where the summation ($\Sigma$) is over all projection views used to reconstruct the image; $I_{(x,y,z)}$ is the image value at pixel location x,y,z; $P_{(r,\theta,\phi)}$ is the back projected value from the projection view at view angle $\theta$, $\phi$; $C_{(x,y,z)}$ is the composite image value at the pixel location x,y,z; and $P_c(r,\theta,\phi)$ is the projection profile value from the composite image at the view angle $\theta$, $\phi$.

4. The method as recited in claim 1 which includes:
   f) acquiring projection views for a mask image of the subject positioned in the FOV; and
   g) subtracting mask image projection views from corresponding projection views acquired in step a) prior to performing step d) therewith.

5. The method as recited in claim 4 which includes:
   h) reconstructing a mask image from the projection views acquired in step f); and
   i) adding the mask image to each diffusion weighted image reconstructed in step d) prior to performing step e) therewith.

6. The method as recited in claim 1 in which the composite image produced in step c) is reconstructed from substantially all the projection views in all the undersampled image data sets acquired in step a).

7. The method as recited in claim 1 in which a different composite image is produced in step c) for each diffusion weighted image reconstructed in step d) and in which each different composite image is produced with projection views from different ones of the undersampled image data sets acquired in step a).

8. The method as recited in claim 7 in which each composite image is produced using projection views from the undersampled image data set being reconstructed and projection views from undersampled image data sets that are motion sensitized in directions near the motion sensitized direction of the undersampled image data set being reconstructed.

9. The method as recited in claim 4 in which the mask projection views acquired in step f) are interleaved and form undersampled mask image data sets that are motion sensitized with gradients directed along substantially the same directions as the undersampled image data sets acquired in steps a) and b).

10. The method as recited in claim 9 which includes:
    reconstructing a mask image using mask projection views corresponding to those in the undersampled image data set being reconstructed and mask projection views from undersampled mask projection data sets that are motion sensitized in directions near the motion sensitizing direction of the mask projection views corresponding to those in the undersampled image data set being reconstructed; and
    reprojecting the mask image at view angles corresponding to the view angles of the projection views in the image data set being reconstructed and using the reprojected mask image projection views in step g).

11. The method as recited in claim 9 which includes:
    producing separate mask image for each undersampled image data set being reconstructed;
    reprojecting each mask image; and
    subtracting the reprojected mask image projection views from corresponding projection views in the undersampled image data sets being reconstructed.

12. The method as recited in claim 11 which includes adding each mask image to its corresponding diffusion weighted image reconstructed in step d) prior to performing step e) therewith.

* * * * *

UNITED STATES PATENT AND TRADEMARK OFFICE
CERTIFICATE OF CORRECTION

PATENT NO. : 7,358,730 B2
APPLICATION NO. : 11/524751
DATED : April 15, 2008
INVENTOR(S) : Charles A. Mistretta et al.

Page 1 of 1

It is certified that error appears in the above-identified patent and that said Letters Patent is hereby corrected as shown below:

Column 4, line 45, Eq. (3), "$I(x,y,z)=\sum(P(r,\theta,\phi) * C(x,y,z)_{(r,\theta,\phi)}/P_c(r,\theta,\phi)$"

should be --$I(x,y,z)=\sum(P(r,\theta,\phi) * C(x,y,z)_{(r,\theta,\phi)}/P_c(r,\theta,\phi))$--.

Column 13, Claim 3, line 49, "$I(x,y,z)=\sum(P(r,\theta,\phi) * C(x,y,z)_{(r,\theta,\phi)}/P_c(r,\theta,\phi)$"

should be --$I(x,y,z)=\sum(P(r,\theta,\phi) * C(x,y,z)_{(r,\theta,\phi)}/P_c(r,\theta,\phi))$--.

Signed and Sealed this
Tenth Day of May, 2011

David J. Kappos
*Director of the United States Patent and Trademark Office*